(12) United States Patent
Jogdand et al.

(10) Patent No.: US 9,268,742 B2
(45) Date of Patent: Feb. 23, 2016

(54) RECONFIGURABLE VARIABLE LENGTH FIR FILTERS FOR OPTIMIZING PERFORMANCE OF DIGITAL REPEATER

(71) Applicant: Intel Corporation, Santa Clara, CA (US)

(72) Inventors: Manasi Jogdand, Hyderabad (IN); Surya Bhamidipati, Hyderabad (IN); Jatin Uppal, Hyderabad (IN); Torbjorn Olsson, Kista (SE)

(73) Assignee: Intel Corporation, Santa Clara, CA (US)

( * ) Notice: Subject to any disclaimer, the term of this patent is extended or adjusted under 35 U.S.C. 154(b) by 317 days.

(21) Appl. No.: 13/910,902

(22) Filed: Jun. 5, 2013

(65) Prior Publication Data

US 2013/0332499 A1     Dec. 12, 2013

Related U.S. Application Data

(60) Provisional application No. 61/655,835, filed on Jun. 5, 2012.

(51) Int. Cl.
| | | |
|---|---|---|
| *G06F 17/10* | (2006.01) | |
| *H03H 17/02* | (2006.01) | |
| *H03H 17/06* | (2006.01) | |

(52) U.S. Cl.
CPC ........... *G06F 17/10* (2013.01); *H03H 17/0294* (2013.01); *H03H 17/06* (2013.01)

(58) Field of Classification Search
None
See application file for complete search history.

(56) References Cited

U.S. PATENT DOCUMENTS

| | | | | | |
|---|---|---|---|---|---|
| 4,703,447 | A | * | 10/1987 | Lake, Jr. | ........................ 708/319 |
| 6,167,415 | A | * | 12/2000 | Fischer et al. | ................. 708/320 |

(Continued)

FOREIGN PATENT DOCUMENTS

| | | |
|---|---|---|
| CN | 104584002 A | 4/2015 |
| DE | 112013002793 T5 | 4/2015 |
| WO | 2010/003536 | 1/2010 |

(Continued)

OTHER PUBLICATIONS

International Search Report and Written Opinion in corresponding PCT application No. PCT/US2013/044313, Dec. 13, 2013, 8 pp.

(Continued)

*Primary Examiner* — David H Malzahn
(74) *Attorney, Agent, or Firm* — Schwegman Lundberg & Woessner, P.A.

(57) ABSTRACT

The invention addresses the problem of parameter optimization for best filter performance and, in particular, the influence from the requirements on radio or fiber to radio repeaters utilizing those filters, that often proves to be conflicting for an FIR filter. The FIR filters are implemented in a programmable circuit and are not thereby restricted for use in communication repeaters although this particular usage may put the most serious restrictions on the filter performance. Within the imposed constraints, this disclosure illustrates a method to strike a middle ground while minimizing the trade-offs. The advantage of the concept presented allows the choice of a suitable filter pertaining to a particular traffic configuration, meaning a particular choice of individually filtered frequency bands set at different gain and intended to support a diversity of traffic formats. The disclosed approach banks on the reconfigurable variable length FIR filter architectures. Implementation architecture and results in brief are also presented.

8 Claims, 8 Drawing Sheets

(56) References Cited

U.S. PATENT DOCUMENTS

| | | |
|---|---|---|
| 6,891,482 B2 | 5/2005 | Craven et al. |
| 7,024,440 B2 * | 4/2006 | Wiener .......................... 708/319 |
| 2004/0078403 A1 | 4/2004 | Scheuermann et al. |
| 2005/0283508 A1 | 12/2005 | Hennedy |
| 2008/0292116 A1 * | 11/2008 | Wu .............................. 381/120 |
| 2013/0332499 A1 * | 12/2013 | Jogdand et al. ............... 708/300 |

FOREIGN PATENT DOCUMENTS

WO     WO2013/184801 A2     12/2013

OTHER PUBLICATIONS

"International Application Serial No. PCT/US2013/044313, International Preliminary Report on Patentability mailed Dec. 23, 2014", 6 pgs.

\* cited by examiner

RECONFIGURABLE VARIABLE LENGTH FIR FILTERS FOR OPTIMIZING PERFORMANCE OF DIGITAL REPEATER

BACKGROUND OF THE INVENTION

Repeaters are deployed to increase the coverage area of a wireless communication system. A repeater is comprised of two assemblies: Donor and Service. The Donor assembly receives data from Donor base station, amplifies, filters the received signal and transmits the amplified and filtered signal from radio unit. Communication with the base station is done via the Donor antenna. The Service assembly receives data from service radio unit, amplifies, filters the received signal and transmits the amplified and filtered signal from the base station. Communication with radio unit is done via the Service antenna.

Repeaters use Finite Impulse Response (FIR) filters as part of signal processing. In general, FIR filter synthesis is constrained by pass band ripple, stop band rejection, roll-off, group delay (GD) and group delay distortion (GDD). The distortion the filter imposes on the signal causes an increase in the signal's error vector magnitude (EVM). Pass band ripple both in the amplitude and in the phase domain contribute to the added EVM from the digital filter and the phase ripple is closely related to the GDD. The latency or GD is closely related to the filter length which is also related to the cost of implementation in terms of resource of the programmable circuit. One wishes to reduce both cost and latency of course. Improving the filter on some parameters, results in degradation of some other parameters. For example, targeting for better group delay limits the improvement on other parameters like pass band ripple or stop band rejection, etc. The stop band rejection on the other hand must be sufficient for at least two reasons. First, the regulatory body limits the out of band gain and thereby the "gain" of the repeater is limited. Second, a larger gain in an adjacent frequency band means that some signal in the band of interest can sneak through the adjacent bands filter and interfere at the common output thereby causing EVM. Thus a filter is also characterized by the allowed gain difference "Difference Gain" a filter can have without destroying the traffic passing mainly through an adjacent sub-band. The following Table 1 illustrates the above mentioned trade-off between signal performance parameters.

TABLE 1

Filter parameter specifications

| # | Group Delay (nS) | Filter Length | BW (MHz) | Gain (dB) | Difference Gain (dB) | Ripple/EVM |
|---|---|---|---|---|---|---|
| 1 | 9.0 | 35 | 0.2 | 100 | 25 | 0.2 |
| 2 | 8.0 | 31 | 0.2 | 100 | 20 | 0.3 |
| 3 | 6.0 | 27 | 0.2 | 90 | 20 | 0.3 |

With current filter techniques available, it is not possible to generate a filter with all the parameters at their best. FIG. 1 shows FIR Filter synthesis constraints trade-off. Repeater requirements vary depending on many factors such as Radio Access Technology (RAT) supported, Bandwidth available, Channel spacing, Repeater gain, Repeater Delay. Different repeater requirements imply different filter constraints. Repeater requirements limit improvement of some filter parameters while targeting other filter parameters. And thus, a fixed FIR filter structure does not accommodate all of the different repeater requirements.

Trade-offs in filter structure are shown in FIGS. 2 and 3 with regard to the following examples: a) for the same group delay of 2.8 µs, higher rejection can be achieved by sacrificing the outer most band or by allowing higher ripple in the pass-band; and b) frequency plots in FIGS. 2A and 2B show a 5 MHz filter for a same group delay that has lower rejection with a relatively flat pass band than the one shown in FIGS. 2C and 2D, which has a higher rejection but with a greater ripple in the pass band. It is well known that given a higher allowance in group delay, better rejection, flat pass band etc., can be obtained. A 5 MHz filter with a higher group delay (4 µs) is shown in FIGS. 3A and 3B.

SUMMARY OF THE INVENTION

The present invention is a repeater with a reconfigurable variable length FIR filter that resolves the limitations of existing repeater FIR filters noted above. In the present approach, the FIR filter is not modified but is reprogrammed by the controller/processor to achieve both characteristics represented in FIGS. 2 and 3. The advantages of the repeater of the present invention with a reconfigurable variable length FIR filter include:

1. Many repeaters use fixed filters meaning though they are programmable for a few different bandwidths, they are not flexible in terms of group delay, meaning a filter that is designed for 180 coefficients, for example, can be programmed for different bandwidths.

2. The disclosed new architecture can also change the number of coefficients, apart from the BW/Pass-band Ripple etc. This gives advantage in terms of scaling without having to change the entire FPGA image, which otherwise would have needed a higher storage memory.

While trying to reduce the trade-offs, the reconfigurable variable length FIR filter helps to avoid permanent disadvantageous situations. Some repeater requirements may allow more group delay while other requirements may allow more pass band ripple etc. This can be achieved with the present reconfigurable variable length filter. Reconfiguration enables use of the same filter for different repeater requirements on the fly without any change in design.

The reconfigurable filter addresses the problem of parameter optimization for best filter performance and in particular the influence, from the requirements on radio or fiber to radio repeaters utilizing those filters, that often proves to be conflicting for an FIR filter. The FIR filters of the invention are implemented in a programmable circuit and are not thereby restricted for use in communication repeaters although this particular usage may put the most serious restrictions on the filter performance. The invention provides a middle ground while minimizing the trade-offs. The advantage of the invention allows the choice of a suitable filter pertaining to a particular traffic configuration, meaning a particular choice of individually filtered frequency bands set at different gain and intended to support a diversity of traffic formats. The reconfigurable variable length FIR filter architecture provides that functionality.

BRIEF DESCRIPTION OF THE DRAWINGS

FIG. 2 comprising

FIG. 3 comprising

DETAILED DESCRIPTION OF THE INVENTION

Figure 1:
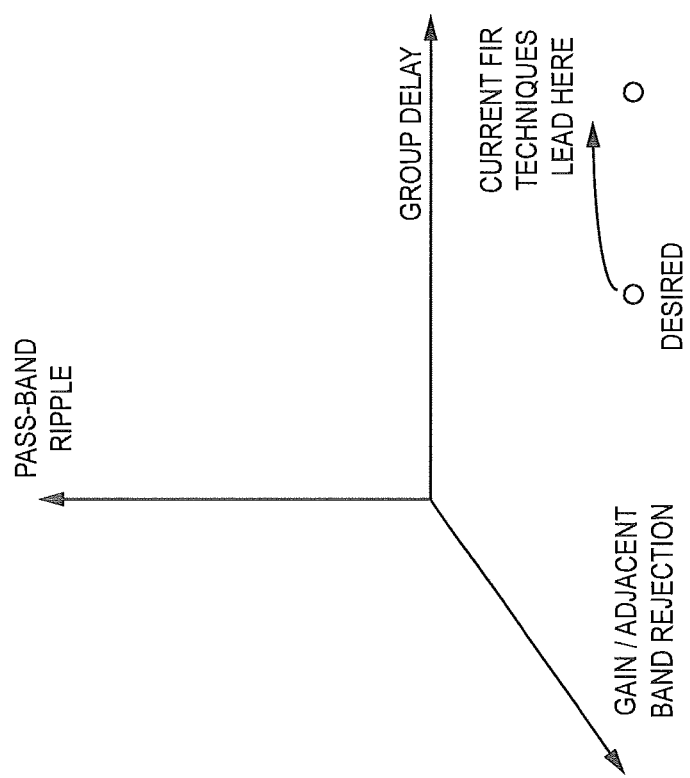
FIG. 1 is graph representing FIR filter trade-off constraints.
Figure 2A:
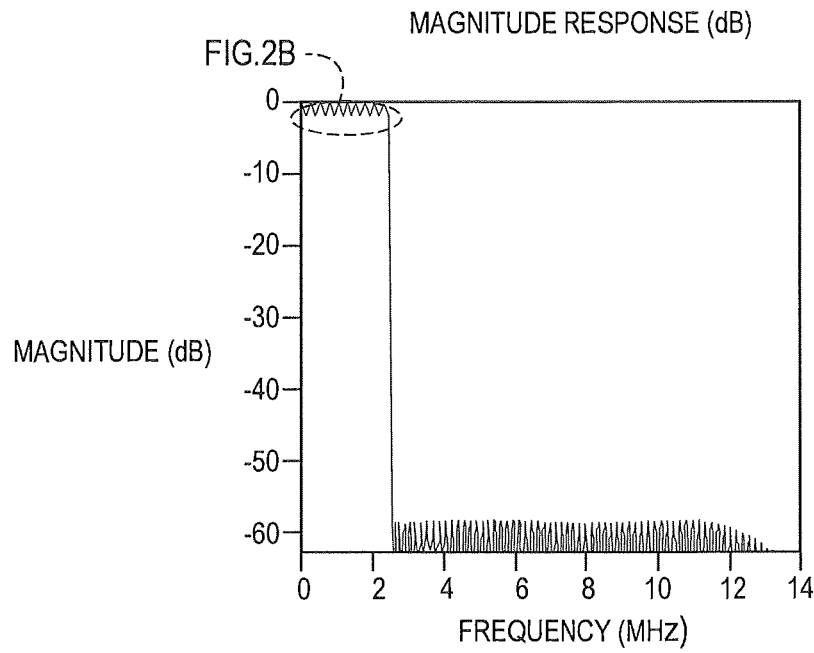
FIGS. 2A-2D is a set of graphs showing FIR filter responses generally observed.
Figure 2B:
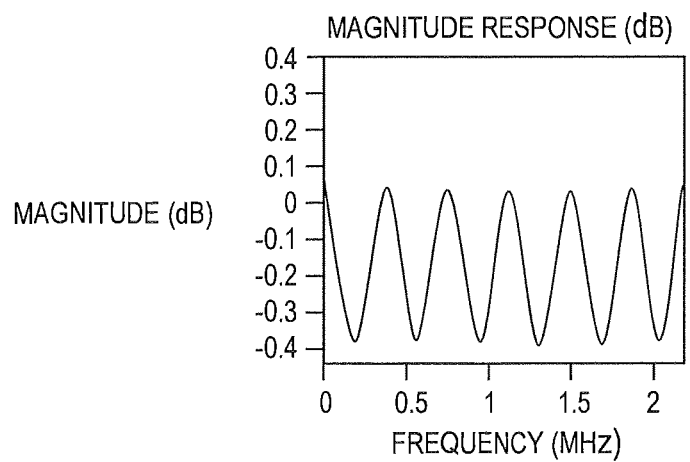
Figure 2C:
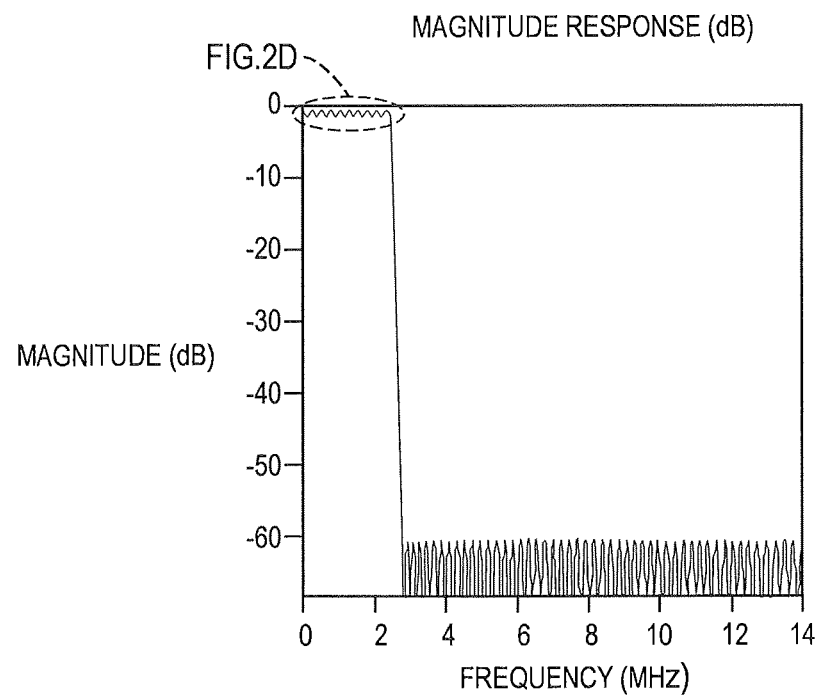
Figure 2D:
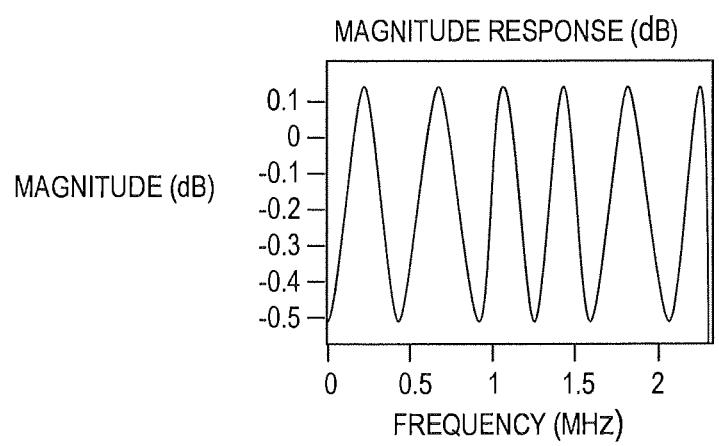
Figure 3A:
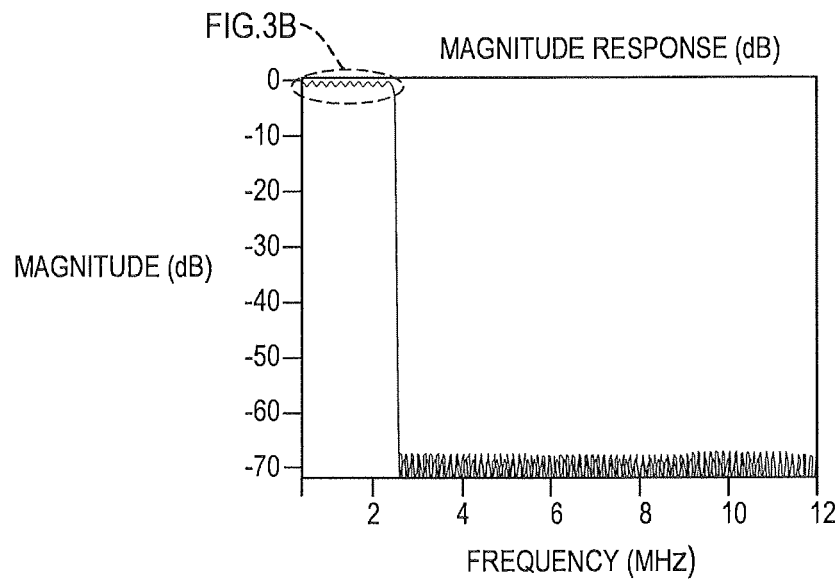
FIGS. 3A and 3B is a set of graphs showing the FIR filter response of the present invention.
Figure 3B:
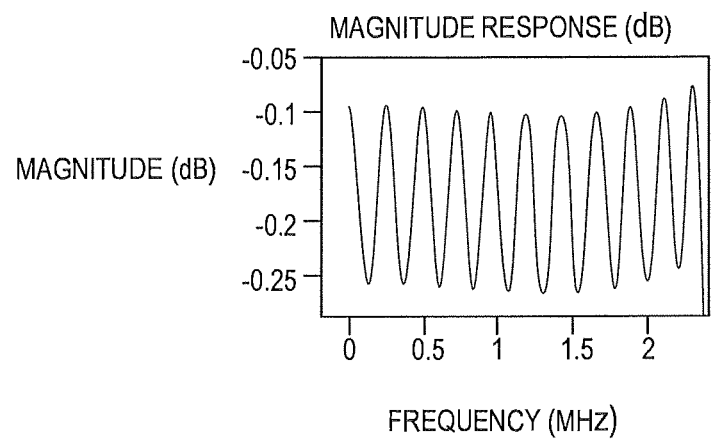
Figure 4:
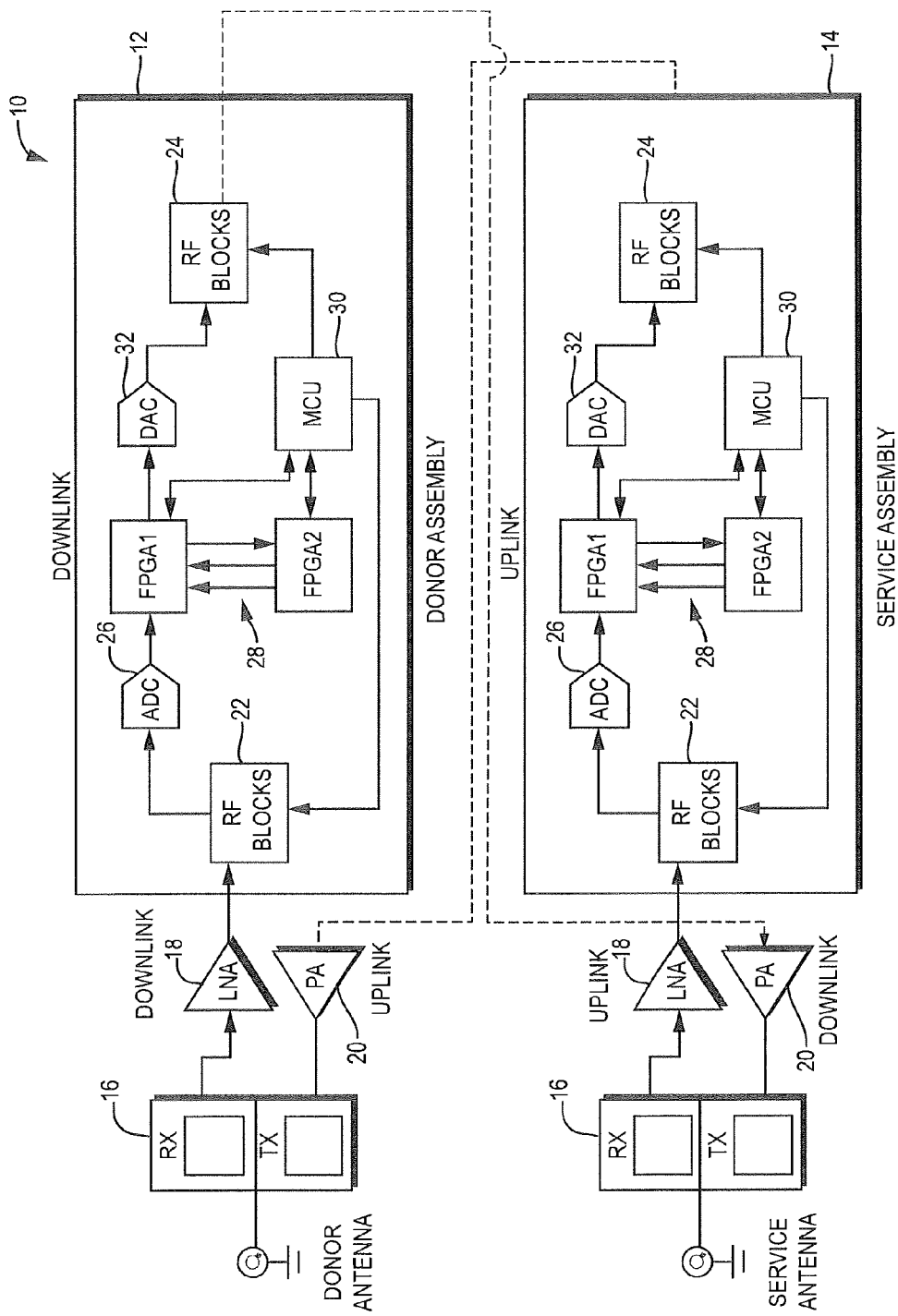
FIG. 4 is a simplified diagram of the architecture of a digital repeater.

The present invention is directed to providing a digital repeater 10 employing reconfigurable variable length FIR filters. Referring to FIG. 4, the architecture of the repeater 10 is shown. The repeater 10 includes two primary blocks, a donor assembly 12 and a service assembly 14. Each includes: a) a duplexer 16 that enables the use of the same antenna for reception and transmission; b) a Low Noise Amplifier (LNA) 18; c) a Power Amplifier (PA) 20; d) a Radio Frequency (RF) receive section 22; e) a RF transmit section 24; f) an Analog-to-Digital Controller (ADC) 26 that converts analog signal to digital for further signal processing to be done in digital form; g) a digital processing section 28 for sub-band filtering and gain control; h) a Master Control Unit (MCU) 30 or primary processing controller for receiving and transmitting instructions from and to other components of the repeater 10; and i) a Digital-to-Analog (DAC) 32 to convert digital signal back to analog after digital signal processing by the digital processing section 28. The repeater 10 supports multiple sub-bands within the specified allocated band. Each sub-band is processed differently. Depending on the repeater requirements, each sub-band provides different gain, and filtering.

Figure 5:
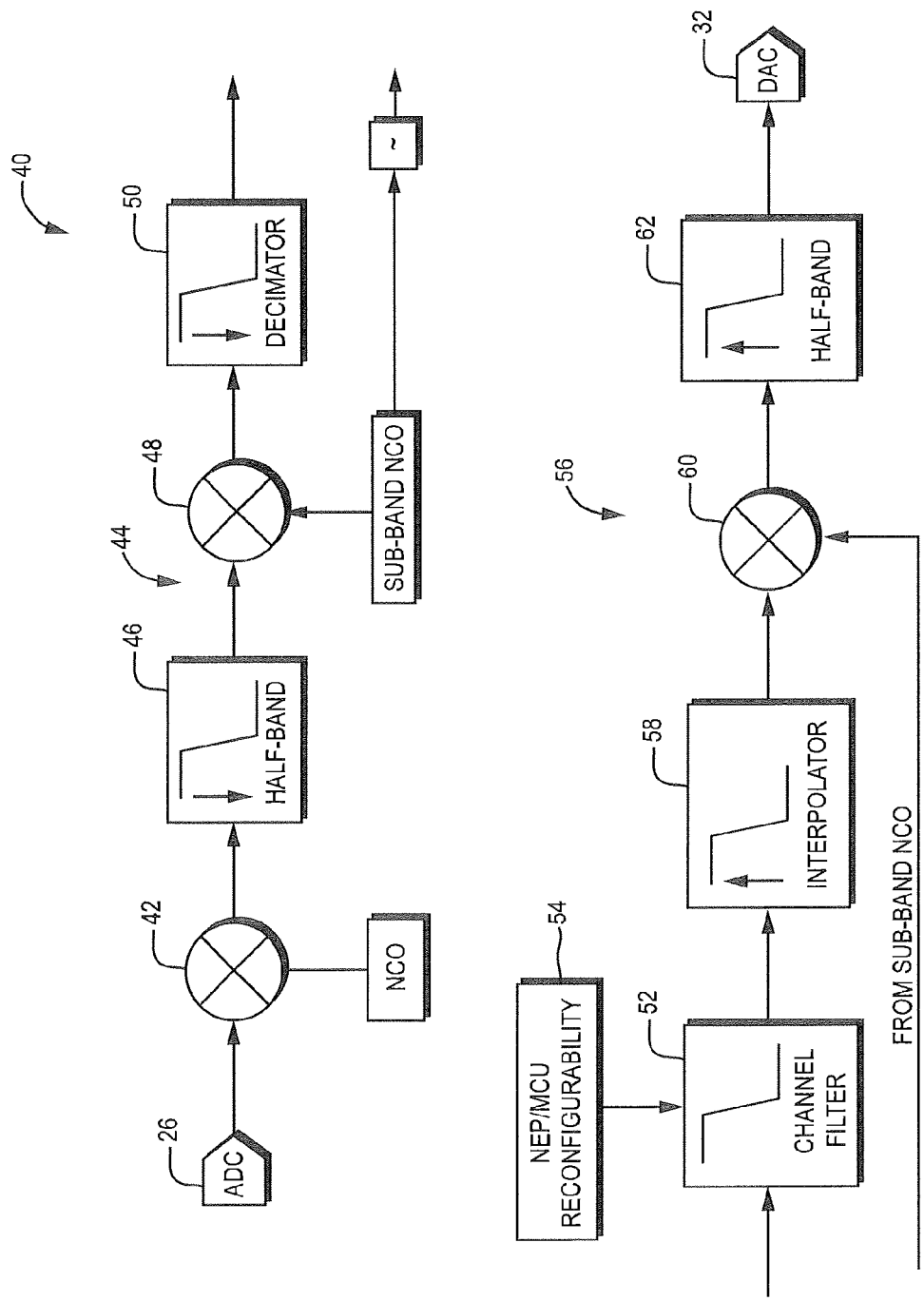
FIG. 5 is a simplified diagram of the sub-band architecture of the repeater.

The repeater 10 includes a sub-band architecture 40 of the digital processing section 28 as shown in FIG. 5. The sub-band architecture 40 includes the following functional blocks: a) a NCO/Mixer 42 configured to bring bands centered at IF to Baseband b) a Digital Down Converter (DDC) 44 including a half-band filter 46 (common to all sub-bands), a sub-band NCO/mixer 48 that brings individual sub-bands placed in band to center, a decimator 50 arranged to account for output sampling rates that are different for each sub-band depending on the channel filter; c) a channel filter 52 includes a reconfigurable variable length FIR filter of the present invention, wherein repeater requirements impose constraints on the channel filter 52 such that filtering is done according to repeater specification (Gain, BW, EVM, RAT, etc.) and that is programmable by a user through NEP/MCU controller 54 that accordingly reloads specific filter coefficients; and d) a Digital Up Converter (DUC) 56 that includes an interpolator 58 that converts sampling rates back), a mixer 60 that places sub-bands back to the offset in band, and a half-band filter 62 (common to all sub-bands). The components of the sub-band architecture 40 are configured in Field Programmable Gate Arrays (FPGA) 1 and 2 of the digital section 28 of the repeater 10 in a manner know to those of skill in the art of repeater formation.

Figure 6:
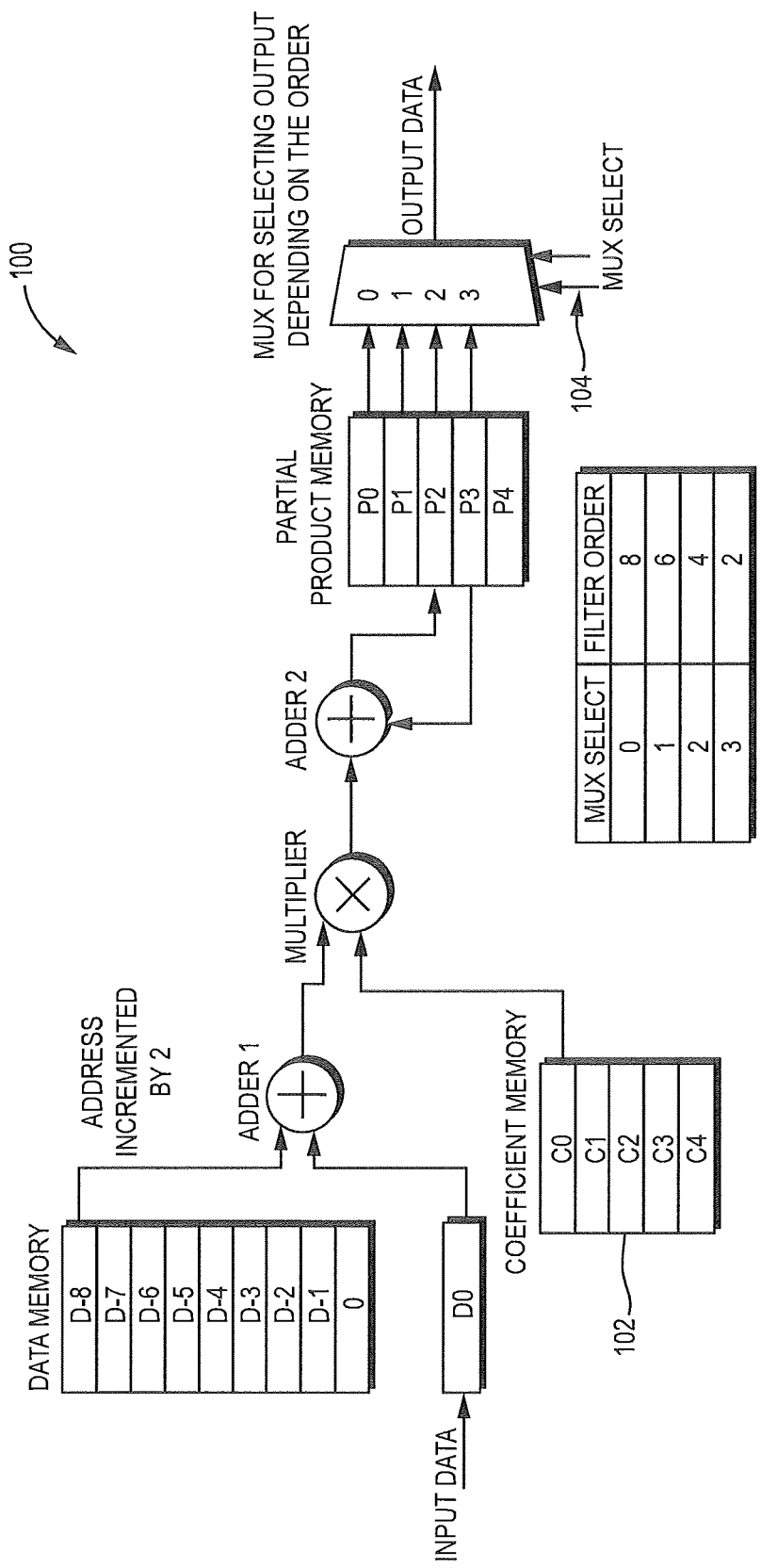
FIG. 6 is a representation of the structure of the FIR filter of the present invention.

FIG. 6 shows a preferred embodiment of a reconfigurable variable length FIR filter 100 of the repeater 10. The filter 100 can be reconfigured by writing coefficients to coefficient memory 102. Also depending upon the order of the filter 100, a particular filter output is selected from available different outputs. The reconfigurable variable length structure of the filter 100 allows changing the filter order by selecting partial products as output. This structure is scalable and also can be generalized for different sampling frequencies and clock frequencies.

Figure 7:
FIG. 7 is a representation of a FIR filter coefficient set header.

For different repeater requirements, different filter coefficient sets are generated and stored in flash memory. Each filter coefficient set has a header describing filter specifications along with the coefficients. Coefficient set headers of the filter 100 are shown in FIG. 7. Depending on the repeater requirement, the filter 100 is programmed with a respective filter coefficient set. Output multiplexer (mux) select lines 104 are set according to length of the filter 100.

An example filter data flow for a 4th order FIR odd symmetric filter of the present invention is set out as follows in regard to Tables 2-4.

TABLE 2

FIR Filter data flow

| | Data Cycle | | | | | | |
|---|---|---|---|---|---|---|---|
| | 1 | 2 | 3 | 4 | 5 | 6 | Comments |
| | | | | Present Data | | | |
| | d0 | d1 | d2 | d3 | d4 | d5 | Input data |
| | | | | Data Memory | | | |
| 5$^{th}$ | 0 | 0 | 0 | 0 | d0 | d1 | Data memory size |
| 4$^{th}$ | 0 | 0 | 0 | d0 | d1 | d2 | is equal to # of |
| 3$^{rd}$ | 0 | 0 | d0 | d1 | d2 | d3 | taps. 1st location |
| 2$^{nd}$ | 0 | d0 | d1 | d2 | d3 | d4 | always 0 for odd |
| 1$^{st}$ | 0 | 0 | 0 | 0 | 0 | 0 | symmetric structure. Data will be filled from 1st location for even symmetric structure. |
| | | | | Adder1 | | | |
| | | | | Input1 | | | |
| | d0 | d1 | d2 | d3 | d4 | d5 | Input 1 is present Data |
| | | | Input2 (Input 2 is alternate data from Data memory) | | | | |
| | 0 | 0 | 0 | 0 | d0 | d1 | Data memory location: 5 |

TABLE 2-continued

FIR Filter data flow

| | | Data Cycle | | | | |
|---|---|---|---|---|---|---|
| 1 | 2 | 3 | 4 | 5 | 6 | Comments |
| 0 | 0 | d0 | d1 | d2 | d3 | Data memory location: 3 |
| 0 | 0 | 0 | 0 | 0 | 0 | Data memory location: 1 |

Adder1 Output/Multiplier Input1

| | | | | | | |
|---|---|---|---|---|---|---|
| d0 | d1 | d2 | d3 | d4 + d0 | d5 + d1 | Adder 1 output is |
| d0 | d1 | d2 + d0 | d3 + d1 | d4 + d2 | d5 + d3 | used as input to |
| d0 | d1 | d2 | d3 | d4 | d5 | the multiplier |

Coefficient Memory/Multiplier Input2

| | | | | | | |
|---|---|---|---|---|---|---|
| c0 | c0 | c0 | c0 | c0 | c0 | Coefficient |
| c1 | c1 | c1 | c1 | c1 | c1 | Memory stores |
| c2 | c2 | c2 | c2 | c2 | c2 | only distinct coefficients. So for symmetric structures, it stores only half coefficients |

Multiplier Output/Adder2 Input1

| | | | | | | |
|---|---|---|---|---|---|---|
| d0 * c0 | d1 * c0 | d2 * c0 | d3 * c0 | (d4 + d0) * c0 | (d5 + d1) * c0 | Multiplier output is |
| d0 * c1 | d1 * c1 | (d2 + d0) * c1 | (d3 + d1) * c1 | (d4 + d2) * c1 | (d5 + d3) * c1 | then added with previous partial |
| d0 * c2 | d1 * c2 | d2 * c2 | d3 * c2 | d4 * c2 | d5 * c2 | products to generate new partial products |

Adder2 Input2 (Partial Product Memory Read)

| | | | | | | |
|---|---|---|---|---|---|---|
| 0 | d0 * c1 | (d1 * c1) + (d0 * c2) | ((d2 + d0) * c1) + (d1 * c2) | ((d3 + d1) * c1) + (d2 * c2) | ((d4 + d2) * c1) + (d3 * c2) | While reading, 1st partial memory data is discarded. |
| 0 | d0 * c2 | d1 * c2 | d2 * c2 | d3 * c2 | d4 * c2 | 2nd partial memory data is added with 1st multiplier output and then stored in 1st location of the partial product memory. Last multiplier output is added with 0 data. |
| 0 | 0 | 0 | 0 | 0 | 0 | |

Adder 2 Output (Partial Product Memory Write)

| | | | | | | |
|---|---|---|---|---|---|---|
| d0 * c0 | (d1 * c0) + (d0 * c1) | (d2 * c0) + (d1 * c1) + (d0 * c2) | (d3 * c0) + ((d2 + d0) * c1) + (d1 * c2) | ((d4 + d0) * c0) + ((d3 + d1) * c1) + (d2 * c2) | ((d5 + d1) * c0) + ((d4 + d2) * c1) + (d3 * c2) | 4th order filter output |
| d0 * c1 | (d1 * c1) + (d0 * c2) | ((d2 + d0) * c1) + (d1 * c2) | ((d3 + d1) * c1) + (d2 * c2) | ((d4 + d2) * c1) + (d3 * c2) | ((d5 + d3) * c1) + (d4 * c2) | 2nd order filter output |
| d0 * c2 | d1 * c2 | d2 * c2 | d3 * c2 | d4 * c2 | d5 * c2 | |

Filter Output

4th order filter | Filter

| | | | | | | |
|---|---|---|---|---|---|---|
| d0 * c0 | (d1 * c0) + (d0 * c1) | (d2 * c0) + (d1 * c1) + (d0 * c2) | (d3 * c0) + ((d2 + d0) * c1) + (d1 * c2) | ((d4 + d0) * c0) + ((d3 + d1) * c1) + (d2 * c2) | ((d5 + d1) * c0) + (d4 + d2) * c1) + (d3 * c2) | structure will remain same irrespective of filter order. Only |

2nd order filter

| | | | | | | |
|---|---|---|---|---|---|---|
| d0 * c1 | (d1 * c1) + (d0 * c2) | ((d2 + d0) * c1) + (d1 * c2) | ((d3 + d1) * c1) + (d2 * c2) | ((d4 + d2) * c1) + (d3 * c2) | ((d5 + d3) * c1) + (d4 * c2) | change will be in filter output tap points. |

The 4th order filter will have four delay blocks. Thus it requires four previous data to be stored in memory. In Table 2, five memory locations are used with one location being always zero. This is done for the convenience in implementation.

In a particular data cycle detailed more fully in Tables 3 and 4, input data/present data is added with alternate data in data memory. E.g., for the 4th order filter, present data is added with data in $5^{th}$, $3^{rd}$ and $1^{st}$ memory locations ($5^{th}$ is the most delayed data). Thus three additions will be performed. These three outputs will be multiplied with respective coefficients present in the coefficient memory. As the structure is symmetric, first coefficient is multiplied with most delayed data and present data. Here C0 is the first and last coefficient, C1 is the second and fourth coefficient and C2 is the middle one. Thus three multiplications will be performed. These multiplier outputs are then added with the respective partial products for previous data cycle to generate new partial products. In general, to get $n^{th}$ partial product, $n^{th}$ multiplier output is added with $(n+1)^{th}$ previous partial product. Thus three such additions will be performed to produce three partial products.

In this example, Adder-Multiplier-Adder operations are performed sequentially. So, the number of operations for $4^{th}$ order symmetric FIR filter is three. Different order outputs are tapped out from different partial product memory locations which are then connected to mux. Depending upon mux selection lines, corresponding filter output is selected. These operations can be performed sequentially or in parallel depending upon the number of clocks available in data cycle. E.g., If the number of clocks available in the data cycle=n, and operations to be performed are m*n, then n sequential operations and m parallel operations will be performed.

TABLE 3

FIR Filter Implementation specification

| Clock Frequency | $F_{CLK}$ | |
|---|---|---|
| Sampling Frequency | $F_S$ | |
| # Cycles | $N_{CYCLE}$ | $F_{CLK}/F_S$ |
| Filter Order | N | |
| # Coefficients | T | N + 1 |
| Filter structure | Symmetric | |
| # Distinct Coefficients | $N_{COEFF}$ | EVEN(T)/2 |
| | | EVEN(T) = T + 1 ... Odd symmetry |
| | | = T ... Even symmetry |

TABLE 4

Resource utilization

| # DSPs | $N_{DSP}$ | $N_{COEFF}/N_{CYCLE}$ |
|---|---|---|
| Coefficient | CoeffSize | # bits to represent Coefficient |
| Memory | CoeffMemWidth | CoeffSize * $N_{DSP}$ |
| | CoeffMemDepth | $N_{CYCLE}$ |
| Data Memory | DataSize | # bits to represent Data |
| | DataMemWidth | DataSize * $N_{DSP}$ * 2 |
| | DataMemDepth | $N_{CYCLE}$ |
| Partial Product | PPDataSize | # bits to represent Partial Product |
| Memory | PPMemWidth | PPDataSize * $N_{DSP}$ |
| | PPMemDepth | $N_{CYCLE}$ |

With the disclosed reconfigurable variable length FIR filter 100, it is possible to comply with different repeater requirements eliminating further design cycle time. The filter 100 is preferably implemented in Xilinx FPGA which has reasonable resource utilization as compared to Xilinx IP Core. Accordingly, an improved digital repeater is also provided.

The present invention has been described with respect to a specific example. Nevertheless, it will be understood that various modifications may be made without departing from the spirit and scope of the invention. Accordingly, other embodiments are within the scope of the claims appended hereto.

What is claimed is:

1. A reconfigurable FIR filter comprising an field-programmable gate array (FPGA) configured with:
    a data memory to store consecutive samples of input data;
    a coefficient memory to store a set of filter coefficients;
    a partial product memory to store partial products from a plurality of data cycles;
    an output multiplexer configured to select output data from the partial product memory based on a filter order, wherein different outputs from the partial product memory are selected for different filter orders;
    a first adder to add data from a most delayed data location of the data memory to current input data;
    a second adder to generate the partial products for storage in the partial product memory; and
    a multiplier to multiply an output of the first adder with one of the filter coefficients,
wherein the second adder is to add an output of the multiplier with a partial product of a previous data cycle to generate a partial product for a current data cycle for storage in a next storage location in the partial product memory,
    wherein the output multiplexer includes a MUX select input to select an output from the partial product memory based on the filter order,
    wherein the reconfigurable FIR filter is reconfigured by writing the filter coefficients to the coefficient memory, and
    wherein the filter order is changed by changing the output selection from the partial product memory.

2. The filter of claim 1 wherein a particular output of the partial product memory is selected dependent upon the order of the filter.

3. The filter of claim 1 wherein the filter is of reconfigurable variable length structure that allows changing the filter order by selecting the partial products as output.

4. The filter of claim 1 wherein the data memory, the coefficient memory and the partial product memory are configurable based on a number of data cycles determined for different sampling frequencies and clock frequencies.

5. The filter of claim 1 wherein the FPGA is configurable for use of different sets of filter coefficient, each set being selectable.

6. The filter of claim 5 wherein the coefficient memory comprises flash memory.

7. The filter of claim 5 wherein each set of filter coefficient has a header describing filter specifications along with the coefficients to allow selection for a particular repeater specification.

8. The filter of claim 1 wherein the filter is configured for use in a repeater.

* * * * *